United States Patent [19]

Suzaki

[11] 4,136,929
[45] Jan. 30, 1979

[54] APPARATUS FOR GENERATING LIGHT PULSE TRAIN

[75] Inventor: Yasuzi Suzaki, Yokohama, Japan

[73] Assignee: Hitachi, Ltd., Japan

[21] Appl. No.: 635,112

[22] Filed: Nov. 25, 1975

[30] Foreign Application Priority Data

Nov. 29, 1974 [JP] Japan .............................. 49-136186

[51] Int. Cl.² ........................... G02B 5/14; H01S 3/00
[52] U.S. Cl. ............................. 350/96.15; 350/96.16; 331/94.5 C
[58] Field of Search ............ 350/96 C, 96 WG, 96 R, 350/299; 331/94.5 C, 94.5 H

[56] References Cited

U.S. PATENT DOCUMENTS

| 3,558,213 | 1/1971 | Marcatili | 350/96 WG |
| 3,589,794 | 6/1971 | Marcatili | 350/96 WG |
| 3,760,297 | 9/1973 | Thompson | 350/96 WG X |
| 3,849,740 | 11/1974 | Brandt | 350/96 WG X |

Primary Examiner—John K. Corbin
Assistant Examiner—Rolf Hille
Attorney, Agent, or Firm—Craig & Antonelli

[57] ABSTRACT

The ends of a length of optical fiber are coupled to each other to form a closed loop so that light wave may propagate freely through the looped optical fiber. At one or more portions of the looped path of light are provided the sections through which the loop is optically coupled to external equipments. A light pulse is injected through the sections into the loop fiber and a part of it is taken out through the sections each time it completes a cycle of travel through the loop fiber, so that a light pulse train with pulses equidistantly appearing on the time base can be obtained.

49 Claims, 12 Drawing Figures

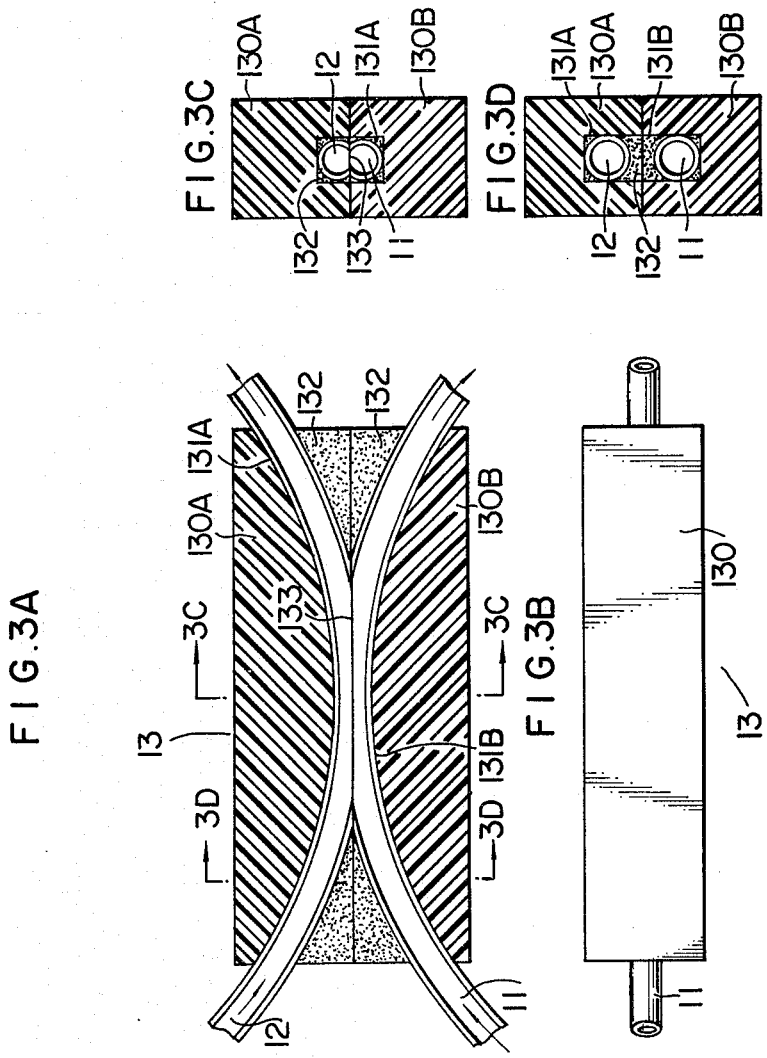

APPARATUS FOR GENERATING LIGHT PULSE TRAIN

BACKGROUND OF THE INVENTION

1. Field of the Invention

The present invention relates to an apparatus for generating a train of light pulses and more particularly to a practical apparatus of generating a light pulse train, having a simple structure and capable of generating a train of pulses having a high repetition rate, in which the ends of a length of optical fiber are coupled to each other to form a closed loop so that light wave may propagate freely through the looped fiber.

2. Description of the Prior Art

As a source of light pulses are known a variety of conventional discharge tubes. With these discharge tubes, the input current is periodically interrupted to generate light pulses. The light pulses thus produced, however, are incoherent, that is consist of light components having various wavelengths, and have a long pulse duration or width and a low repetition frequency, so that the tubes are used only with practical limitations, regarded as improper for optical communications especially designed for very wide band. Through the use of laser apparatus, a train of pulses having an excellent coherency, a short pulse width and a high repetition rate can be obtained. This can be realized by inserting a modulator element in the laser resonator and by performing amplitude modulation with a frequency equivalent to the length of the longitudinal mode of the resonator. The laser system so equipped as to perform such a procedure is called a mode-locked laser. According to this technique, an ideal train of pulses having a very short width and a very high repetition rate can be obtained indeed, but it is not practical in several aspects to use this artifice with the conventional parts or apparatuses. Namely, if it is used with the conventional devices, various difficulties are caused: the over-all structure is too big when it is used in a system where a plurality of mirrors are used to form a loop for light, very severe conditions are imposed upon the mechanical precision and stability of the structure of the frequency stabilizing device, and a very complicated electronic system is required for drive stabilization. Recently, therefore, the use of a semiconductor laser apparatus or a light emitting diode as a light source for generating a train of light pulses used in optical communication, has been proposed since such an apparatus or diode leads to the reduction of size, the improvement in efficiency and the increase in repetition frequency. However, numerous problems still remain to be solved with these light pulse generators.

SUMMARY OF THE INVENTION

One object of the present invention is to provide an apparatus having a simple structure, for generating a train of light pulses having a high repetition rate.

Another object of the present invention is to provide an apparatus having a simple structure, for generating a train of light pulses, which apparatus is hardly influenced by environmental conditions.

According to one feature of the present invention, which has been made to attain above objects, the ends of a length of optical fiber are coupled to each other to form a closed loop so that light wave may propagate freely through the looped optical fiber; at one or more portions of the looped path of light are provided the sections through which the loop is optically coupled to external equipments; and a light pulse is injected through the sections into the loop fiber and a part of it is taken out through the sections each time it completes a cycle of travel through the loop fiber, so that a train of light pulses equidistantly appearing on the time base can be obtained.

According to another feature of the present invention, the ends of a length of optical fiber are coupled to each other to form a closed loop so that wave of light may propagate freely through the looped optical fiber; at one or more portions of the looped path of light are provided the sections through which the loop is optically coupled to external equipments; a light pulse is injected through the sections into the loop fiber and a part of it is taken out through the sections each time it completes a cycle of travel through the loop fiber, so that a light pulse train with pulses equidistantly appearing on the time base can be obtained; and an optical amplifier is inserted in the closed loop of optical fiber so as to positively compensate for the loss of light in the loop or due to coupling mechanism and to produce a train of light pulses having a constant amplitude, so that the path of light pulse is completely closed, free from environmental conditions.

The present invention provides a light pulse generator well adapted to be used in PCM communication and such a pulse generator as having its high repetition rate, makes it possible to multiply the number of transmission channels.

Therefore, the main object of the present invention is to provide a more practical apparatus for generating a light pulse train having high repetition rate, which is based on a simple principle, which has a simple structure and a stable characteristic and which can be easily coupled to light transmission lines or integrated optical circuits, in place of a light pulse generator similar to those used currently, which has various difficulties from the practical point of view, i.e., the standpoint of application especially to optical communication.

Usually, most of optical fibers adapted for light transmission lines are in such a constitution that the refractive index varies continuously or discontinuously along the direction of diameter and therefore the light wave propagates through the fiber while confined within it. According to the present invention a certain length of such optical fiber is prepared and the ends of the length of the fiber are optically coupled to each other to form a loop of optical fiber. The wave of light, when injected once into the loop, is confined within and circulates through, the loop. Moreover, if a light pulse is injected into the looped fiber by means of a device described later, circulates along the loop and is optically coupled to the outside at a portion of the loop by means of a device also described later, then a part of the light pulse can be taken out each time the pulse completes a round of the loop so that a train of pulses equidistantly appearing on the time base can be obtained. The method of injecting a light pulse into the looped optical fiber (hereafter referred to as loop fiber) and of optically coupling the loop fiber to the external equipments, will be, for example, as follows. The loop fiber is put in close contact with another optical fiber. The amplitudes of the train of pulses derived from the loop fiber gradually decrease due to the loses owing to the absorption and dispersion by the loop fiber itself and due to the negative gain owing to external coupling. And if the attenuation of the output due to these loses is compensated by providing a suitable amplifying system, a train of pulses free from amplitude attenuation can be obtained. Further, according to the mechanism of such an optical amplifier, the function of controlling the width of each pulse of the pulse train can be expected so that a train of invariable light pulses can be obtained.

BRIEF DESCRIPTION OF THE DRAWINGS

FIG. 3A is a cross section of a fiber coupling device used in the present apparatus, as another embodiment of the present invention.

FIG. 3B is a side view of the device shown in FIG. 3A.

FIGS. 3C and 3D are respectively cross sections taken along lines 3C—3C and 3D—3D in FIG. 3A.

DESCRIPTION OF THE PREFERRED EMBODIMENTS

Figure 1A:
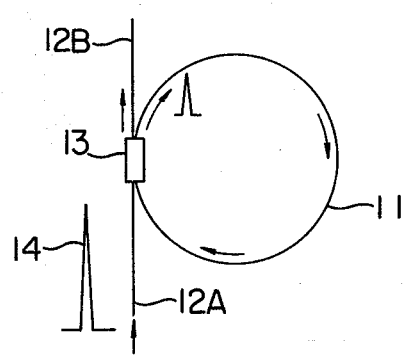
FIG. 1A schematically shows a structure of an apparatus for generating a train of light pulses, as one embodiment of the present invention.
Figure 1B:
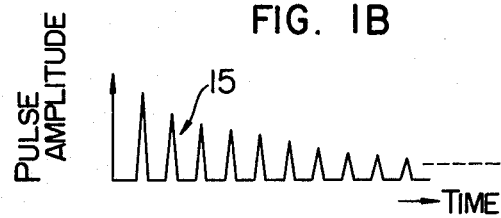
FIG. 1B is a diagram illustrating a train of light pulses generated by the apparatus shown in FIG. 1A.
Figure 4A:
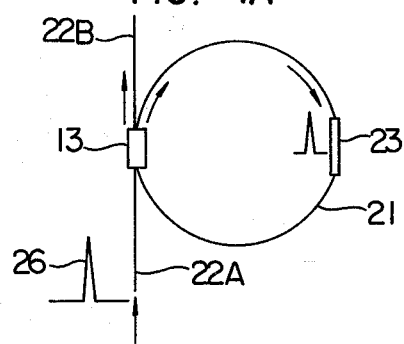
FIG. 4A schematically shows a structure of an apparatus for generating a train of light pulses, as another embodiment of the present invention.
Figure 2A:
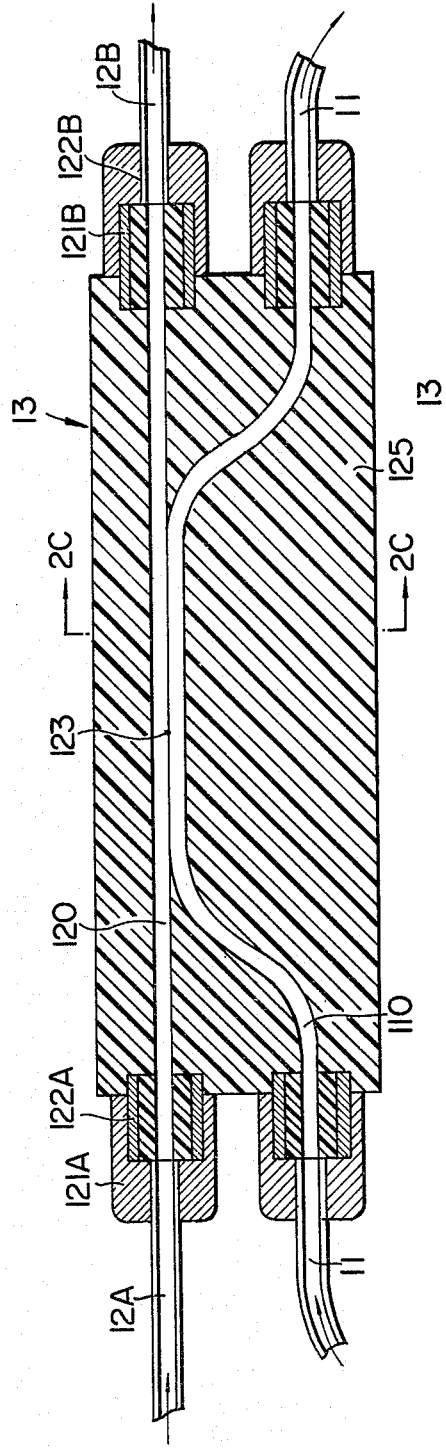
FIG. 2A is a cross section of a fiber coupling device used in the present apparatus, as an embodiment of the present invention.
Figure 2B:
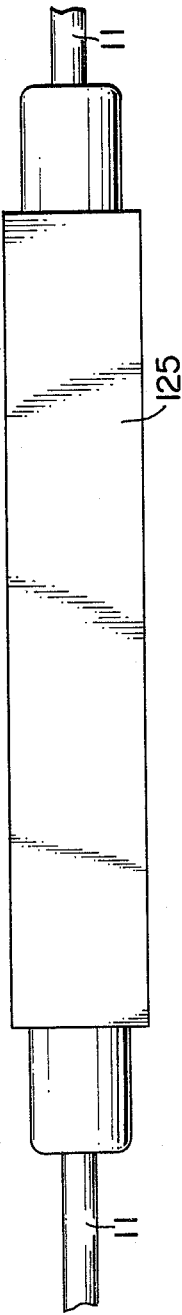
FIG. 2B is a side view of the device shown in FIG. 2A.
Figure 2C:
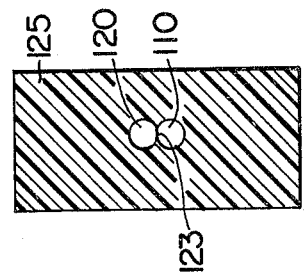
FIG. 2C is a cross section taken along line 2C—2C in FIG. 2A.

FIGS. 1 and 4 show the concrete embodiments of the present invention. FIG. 1A shows an embodiment of the present invention in its simplest form while FIG. 4A shows a modified version of the apparatus shown in FIG. 1A, in which an optical amplifier is inserted in the loop fiber so as to produce a train of equal light pulses. In FIG. 1A, a length of optical fibers 11 has its ends optically coupled to each other so that a loop fiber is obtained. An input fiber 12A and an output fiber 12B are optically coupled to each other via a fiber coupling device 13 and moreover the input and output fibers 12A and 12B are optically coupled to the loop fiber 11 in such a manner that the loss of light and the influence by the external lights are completed eliminated. As shown in FIGS. 2A, 2B and 2C, the fiber coupling device 13 has fibers 120 and 110 fixedly molded with an opaque substance 125, the fiber 120 serving to optically coupling the input fiber 12A to the output fiber 12B and the fiber 110 being a part of the loop fiber 11 and kept in close contact with the fiber 120 for mutual transmission of light therebetween. The fiber 120, as shown in FIGS. 2A and 2C, is in surface contact with the flexed fiber 110 at a portion 123. The surfaces of the portion 123 are obtained by partially cutting and polishing the fibers 120 and 110. The fibers 120 and 110 are shown as nonclad fibers, but a clad fiber may be, of course, used as the fiber 120 or 110. In such a case, the cutting and polishing should be carried out until the cores of the clad fibers are exposed. The ends of the fiber 120 are provided with terminal members 122A and 121B and the ends of the fibers 12A and 12B respectively with terminal members 121A and 122B. The ends of fibers 110 and 11 are also furnished with like terminal members. The optical coupling of one fiber to another is thus performed through the close engagement of one terminal member with another. The fibers 12A and 12B and 11 have claddings. FIG. 2B is a side view of the fiber coupling device.

In the embodiment described above, the fiber 120 is in surface contact with the flexed fiber 110 at the portion 123. However, the fiber 120 may be in line contact with the flexed fiber 110 without cutting and polishing of the fibers 120 and 110 at the portion 123, thereby to achieve an optical couple between the fibers 120 and 110.

The material of the substance 125 is not limited to only an opaque substance but may be a transparent substance having a low refractive index similar to the clad glass' index of the fibers 12A, 12B and 11.

With the fiber coupling device shown in FIG. 2A, a single light pulse 14 injected into the fiber 12 will have a part of it diverted to the loop fiber 11 via the surface contact portion 123 of the fiber coupling device 13. The light pulses, having entered the loop fiber 11, circulates through the loop and a part of the light pulse which completed a round of the loop is again transferred to the fiber 12 through the surface contact area 123 of the coupling device 13. This transfer of a part of the light pulse circulating through the loop fiber 11 to the fiber 12, occurs each time the light pulse passes through the fiber coupling device 13 so that the output train of pulses are as shown in FIG. 1B. The amplitudes of the successive light pulses 15 gradually decrease due to the loss in the loop fiber 11 and the negative gain owing to delivering outputs.

FIGS. 3A, to 3D show another embodiment of the fiber coupling device 13, in which a clad fiber 12 and a clad loop fiber 11 are supported respectively by support members 130A and 130B of opaque substance. The support members 130A and 130B have arcuate grooves 131A and 131B in which the fibers 12 and 11 are to be fitted. The fibers 12 and 11 are inserted in the arcuate grooves 131A and 131B and fixedly fastened to the grooves by means of, for example, opaque adhesive agent. By cutting and polishing those sides of the support members 130A and 130B with the fibers 12 and 11 fixed thereto which are placed face to face in case of contact, the adhesive agent, the clad and the core of each fiber are removed at the top of its arcuate portion as shown in FIGS. 3A and 3C. The thus prepared support members are joined together by a suitable coupling or fixing means so that the cores of the fibers 12 and 11 are optically coupled to each other as shown in FIGS. 3A and 3C.

With the fiber coupling device having such a structure as shown in FIGS. 3A to 3D, a light pulse 14 received at the input end of the fiber 12 is delivered at the output end of the fiber 12 while a part of the light pulse 14 is transmitted to the loop fiber 11 via the contacting surface 133 of the fiber cores. After the transmitted pulse of light has completed a cycle of the loop fiber 11, a part of the circulating light pulse is again turned to the fiber 12 through the contacting surface 133 and delivered at the output end of the fiber 12.

Figure 4B:
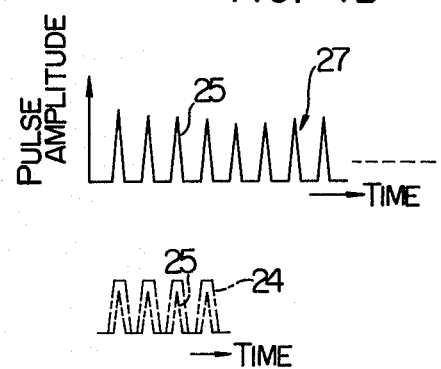
FIG. 4B is a diagram illustrating a train of light pulses generated by the apparatus shown in FIG. 4A.

FIG. 4A shows another embodiment of the present invention, i.e., an apparatus for generating a train of light pulses, which has an optical amplifier inserted in the loop fiber and can deliver a train of constant light pulses as shown in FIG. 4B. Reference numerals 21 indicates a loop fiber, 22A and 22B an input and an output fibers, and 23 an optical amplifier inserted in the loop fiber 21. This optical amplifier 23 must be a medium or so called a laser material, capable of forming a state of a negative temperature or population inversion between transition levels of a specific light wavelength. This requirement is satisfied by a solid laser element of Nd-YAG or Nd-Glass, a liquid laser medium of organic coloring matter, semiconductors and active optical fibers. Numerous devices to serve as sufficiently small optical amplifiers which are adapted for connection with optical fibers, have been developed. Some examples of such devices are described later with the aid of FIGS. 5A to 5C. The amplifier may be subjected to continuous excitation if the relaxation of the inverted distribution due to continuous output or spontaneous emission can be suppressed. For higher efficiency, however, the excitation should take place in synchronism with the light pulse 25, as shown by the waveform 24 in FIG. 4B. The synchronizing signal can be easily derived from the output pulse. With this structure, a train of output pulses having a constant amplitude can be produced by simply injecting a single light pulse 26 from the input end of the fiber 24.

Figure 5A:
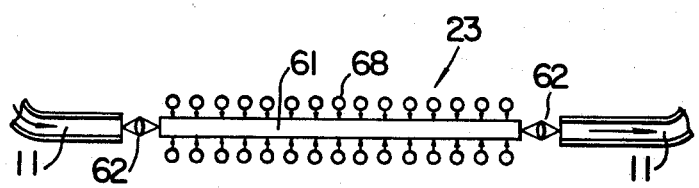
FIGS. 5A and 5B schematically show the exemplary structures of optical amplifiers applicable to the apparatus shown in FIG. 4A.
Figure 5B:
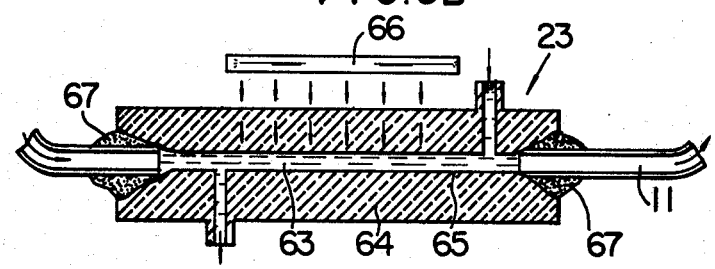
Figure 5C:
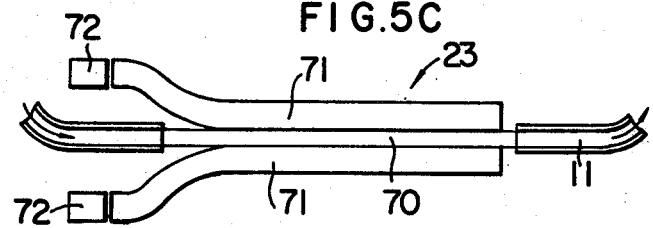
FIG. 5C schematically shows a structure of optical amplifier preferably used in the apparatus shown in FIG. 4A.

FIG. 5A schematically shows the structure of an optical amplifier, in which a short length of optical fiber 61 having no clad and made of Nd-YAG, Nd-Glass is inserted in the loop serving as light path, with the end surfaces of the fiber 61 opposite to the end surfaces of the loop fiber 11 and also placed in the optical conjugate planes of lenses 62. With the lenses 62, the ends of the fibers 61 and 11 may be coupled optically to one another. The light pulse circulating through the loop fiber 11 is amplified when it passes through the fiber 61, by the exciting emission of light from plural LED's (light-emitting diodes) 68 provided on or along the periphery of the fiber 61. FIG. 5B shows another optical amplifier which uses organic chelate compound as laser medium. The liquid 63 containing organic chelate compound, filled in a container 64 of transparent substance, serves as a part, i.e., a straight channel, of optical loop. The exciting light from a lamp 66 penetrates the transparent container 64 and impinges upon the liquid 63. The end surfaces of the loop fiber 11 are disposed in optically parallel to each other and fixed to the container 64 by a suitable adhesive agent 67. FIG. 5C shows an embodiment of an optical amplifier adapted for use in the present apparatus for generating a train of light pulses, in which a glass fiber 70 (e.g. of Nd-YAG) as laser medium is inserted in the optical loop 11 and the end surfaces of the glass fiber 70 are optically parallel to each other and kept in close contact with the end surfaces of the loop fiber 11. A plurality of fibers 71 for conducting the exciting lights from LED's 72 to the fiber 70 are disposed side by side with their side surfaces in contact with the side surface of the fiber 70. In order to minimize the loss of light from the LED's 72, the input end surfaces of the fibers 71 should be close contacted with the surface of the LED's element. Since the light amplifier shown in FIGS. 5A to 5C is housed in a light-blocking casing (not shown), it is never adversely affected by external light. In a preferable structure, four LED's 72 are used and four fiber 71 are disposed around the fiber 70. This structure is adapted to obtain a compact light amplifier.

As described above, by deriving a train of pulses from a single light pulse circulating through a loop fiber, the coupling of output to an optical fiber transmission line or an integrated optical circuit can be facilitated and this artifies can be very effectively applied to an apparatus for generating a train of pulses for use in optical communication. Moreover, according to the present invention, since the amplification of light pulse is unidirectionally performed in the direction of pulse circulation and the amplifier functions as a travelling wave type one, then the output efficiency is excellent. Further, the repetition rate of pulses can be arbitrarily chosen by controlling the length of the loop fiber. Namely, the repetition frequency $\nu$ is given by the expression $\nu = v/L$, where v is the velocity of light pulse propagating through the loop fiber and L is the length of the loop. For example, $\nu$ equals 1 GHz for $v = 2 \times 10^{10}$ cm/sec and $L = 20$ cm. This means that a train of pulses having a repetition rate high enough can be easily obtained. It will be needless to say that the shape of the loop fiber is not limited to a circle. For example, it may consists of several turns and in such a case the diameter of the resulted loop is much smaller than in the case where the loop has only one turn. Moreover, the repetition frequency can be easily changed by exchanging loop fibers having different lengths. The loop fiber is preferably supported by being wound about a column having a circular or polygonal cross section.

A length of the optical loop can slightly and continuously be controlled by the following manner that at least one optical coupler utilizing transferent liquid is inserted into at least one portion of the optical loop to form a part of the optical loop. In the optical coupler, both end surfaces of the optical fiber are opposite to each other through the transparent liquid which optically couples the both end surface of the optical fiber, wherein at least one end surface of the optical fiber can be mechanically slidable to change and control a distance between the both end surfaces of the optical fiber.

By utilizing such optical coupler, the length of the optical loop can be slightly and continuously changed thereby to able to control the repetition frequency continuously. Each pulse will have a width in the order of millimeter if a picosecond pulse now available is used as input and this pulse can retain its shape in propagation through the loop fiber. In addition to these advantages, the present invention can enjoy other practical merits such as follows. The use of a completely closed fiber loop as the circulating path of light pulse almost precludes the adverse external affects. And the structure is very simple so that the fabrication is easy.

I claim:
1. An apparatus for generating a train of light pulses comprising:
   an optical fiber loop, said optical fiber loop including at least one optical fiber having respective ends optically coupled with each other to form a closed loop, and
   optical coupling means arranged in at least one portion of said optical fiber loop for introducing a single light pulse into said optical fiber loop, said optical coupling means further transferring at least a portion of said light pulse from said optical fiber loop each time said light pulse circulates once through said optical fiber loop, such that a train of light pulses being equidistantly spaced in time is generated.

2. An apparatus according to claim 1, wherein said optical coupling means introduces said single light pulse into said optical fiber loop from an input optical fiber, and wherein said optical coupling means transfers said portion of said light pulse from said optical fiber loop into an output optical fiber.

3. An apparatus according to claim 1, wherein said optical coupling means includes a first optical fiber having its ends respectively optically coupled to an input optical fiber and an output optical fiber, and a second optical fiber forming a part of said optical fiber loop, said first and second optical fibers being partially in surface contact with each other.

4. An apparatus according to claim 3, wherein said first and second optical fibers are unclad.

5. An apparatus according to claim 3, wherein said second optical fiber has its respective ends optically coupled to the respective ends of said optical fiber loop.

6. An apparatus according to claim 1, wherein said optical coupling means includes a first curved optical fiber for both receiving said single light pulse and transmitting said train of light pulses generated in said optical fiber loop, and wherein said optical fiber forming said optical fiber loop is provided with a curvature in partial contact with said first curved optical fiber.

7. An apparatus according to claim 6, wherein said first optical fiber and said optical fiber forming said optical fiber loop are both clad, and wherein the cladding and core of the respective optical fibers are so cut and polished at said partial contact to provide a planar contacting surface therebetween.

8. An apparatus according to claim 6, wherein each of said first optical fiber and said optical fiber forming said optical fiber loop have small curvatures.

9. An apparatus according to claim 6, wherein said first optical fiber and said optical fiber forming said optical fiber loop are in said partial contact at tangential portions of the curved optical fibers, said optical fibers being cut and polished to provide a planar contacting surface at said tangential portions.

10. An apparatus according to claim 1, wherein said optical fiber loop is varied in length such that the repetition frequency of said train of light pulses is controlled.

11. An apparatus according to claim 1, wherein said optical fiber loop is formed of an exchangeable optical fiber.

12. An apparatus according to claim 11, wherein said exchangeable optical fiber is variable in length such that the optical length of said optical fiber loop is changed.

13. An apparatus according to claim 12, wherein said optical fiber loop is freely supported.

14. An apparatus according to claim 12, wherein said optical fiber loop is defined by more than one turn of said optical fiber.

15. An apparatus according to claim 11, wherein ends of said optical fiber are movable with respect to one another so as to vary the length of said optical fiber loop.

16. An apparatus according to claim 11, wherein said optical fiber loop is freely supported.

17. An apparatus according to claim 11, wherein said optical fiber loop is defined by more than one turn of said optical fiber.

18. An apparatus according to claim 1, wherein said optical fiber loop is freely supported.

19. An apparatus according to claim 1, wherein said optical fiber loop is defined by more than one turn of said optical fiber.

20. An apparatus for generating a train of light pulses comprising:
an optical fiber loop, said optical fiber loop including at least one optical fiber having respective ends optically coupled with each other to form a closed loop, and
optical coupling means arranged in at least one portion of said optical fiber loop for introducing a single light pulse into said optical fiber loop, said optical coupling means further transferring at least a portion of said light pulse from said optical fiber loop each time said light pulse circulates once through said optical fiber loop such that a train of light pulses being equidistantly spaced in time is generated,
wherein said optical coupling means introduces said single light pulse into said optical fiber loop from an input optical fiber, and wherein said optical coupling means transfers said portion of said light pulse from said optical fiber loop into an output optical fiber,
wherein said optical coupling means includes a first optical fiber having its ends respectively optically coupled to said input optical fiber and said output optical fiber, and a second optical fiber forming a part of said optical fiber loop, said first and second optical fibers being partially in surface contact with each other, and
wherein said first and second optical fibers are in surface contact along at least a portion of the longitudinal length of said first and second optical fibers.

21. An apparatus according to claim 20, wherein said first and second optical fibers are unclad.

22. An apparatus according to claim 20, wherein said second optical fiber has its respective ends optically coupled to the respective ends of said optical fiber loop.

23. An apparatus according to claim 20, wherein said optical fiber loop is varied in length such that the repetition frequency of said train of light pulses is controlled.

24. An apparatus for generating a train of light pulses comprising:
an optical fiber loop, said optical fiber loop including at least one optical fiber having respective ends optically coupled with each other to form a closed loop,
optical coupling means arranged in at least one portion of said optical fiber loop for introducing a single light pulse into said optical fiber loop, said optical coupling means further transferring at least a portion of said light pulse from said optical fiber loop each time said light pulse circulates once through said optical fiber loop, such that a train of light pulses being equidistantly spaced in time is generated, and
optical amplifying means inserted in said optical fiber loop for amplifying said light pulse circulating in said optical fiber loop, such that said train of light pulses has a constant amplitude.

25. An apparatus according to claim 24, wherein said optical amplifying means includes laser means optically coupled with said optical fiber loop for introducing laser light into said optical fiber loop.

26. An apparatus according to claim 25, wherein said laser means includes an unclad optical fiber of laser material inserted in said optical fiber loop and a plurality of light emitting diodes distributed on the periphery of said unclad optical fiber of laser material.

27. An apparatus according to claim 25, wherein said laser means includes a tube containing liquid laser material inserted in said optical fiber loop and means for introducing exciting light into said tube of liquid laser material.

28. An apparatus according to claim 25, wherein said laser means includes an unclad optical fiber of laser material inserted in said optical fiber loop, a plurality of optical fibers disposed with said surfaces in contact with the side surface of said unclad optical fiber of laser material, and a plurality of light emitting diodes introducing exciting light into inlet ends of corresponding ones of said plurality of optical fibers.

29. An apparatus according to claim 24, wherein said optical coupling means introduces said single light pulse into said optical fiber loop from an input optical fiber, and wherein said optical coupling means transfers said portion of said light pulse from said optical fiber loop into an output optical fiber.

30. An apparatus according to claim 24, wherein said optical coupling means includes a first optical fiber having its ends respectively optically coupled to an input optical fiber and an output optical fiber, and a second optical fiber forming a part of said optical fiber loop, said first and second optical fibers being partially in surface contact with each other.

31. An apparatus according to claim 30, wherein said first and second optical fibers are in surface contact along at least a portion of the longitudinal length of said first and second optical fibers.

32. An apparatus according to claim 30, wherein said first and second optical fibers are unclad.

33. An apparatus according to claim 30, wherein said second optical fiber has its respective ends optically coupled to the respective ends of said optical fiber loop.

34. An apparatus according to claim 24, wherein said optical coupling means includes a first curved optical fiber for both receiving said single light pulse and transmitting said train of light pulses generated in said optical fiber loop, and wherein said optical fiber forming said optical fiber loops is provided with a curvature in partial contact with said first curved optical fiber.

35. An apparatus according to claim 34, wherein said first optical fiber and said optical fiber forming said optical fiber loop are both clad, and wherein the cladding and core of the respective optical fibers are so cut and polished at said partial contact to provide a planar contacting surface therebetween.

36. An apparatus according to claim 34, wherein each of said first optical fiber and said optical fiber forming said optical fiber loop have small curvatures.

37. An apparatus according to claim 34, wherein said first optical fiber and said optical fiber forming said optical fiber loop are in said partial contact at tangential portions of the curved optical fibers, said optical fibers being cut and polished to provide a planar contacting surface at said tangential portions.

38. An apparatus according to claim 24, wherein said optical fiber loop is varied in length such that the repetition frequency of said train of light pulses is controlled.

39. An apparatus according to claim 24, wherein said optical fiber loop is formed of an exchangeable optical fiber.

40. An apparatus according to claim 39, wherein said exchangeable optical fiber is variable in length such that the optical length of said optical fiber loop is changed.

41. An apparatus according to claim 24, wherein said optical fiber loop is freely supported.

42. An apparatus according to claim 24, wherein said optical fiber loop is defined by more than one turn of said optical fiber.

43. A method for generating a train of light pulses comprising:
coupling an input light pulse into an optical fiber loop,
circulating said light pulse through said optical fiber loop, and
extracting a portion of said light pulse from said optical fiber loop each time said light pulse circulates onece through said optical fiber loop, thereby generating a train of output light pulses which are equidistantly spaced in time.

44. A method according to claim 43, wherein repetition frequency of said train of light pulses is controlled by varying said optical fiber loop in length.

45. A method according to claim 44, wherein said optical fiber loop is varied in length by exchanging optical fibers of different lengths in said optical fiber loop.

46. A method according to claim 44, wherein said optical fiber loop is varied in length by moving respective ends of an optical fiber forming said optical fiber loop toward and away from one another.

47. A method according to claim 43, wherein said optical fiber loop is formed of an optical fiber being wound into more than one turn.

48. A method according to claim 47, wherein said optical fiber is wound on a column having a circular or polygonal cross-section.

49. A method according to claim 43, wherein said light pulse circulating in said optical fiber loop is optically amplified, thereby generating said train of output light pulses with a constant amplitude.

* * * * *